United States Patent
Om et al.

(10) Patent No.: US 7,149,101 B1
(45) Date of Patent: Dec. 12, 2006

(54) METHOD AND APPARATUS FOR SMOOTHING CURRENT TRANSIENTS IN A CONTENT ADDRESSABLE MEMORY (CAM) DEVICE WITH DUMMY SEARCHES

(75) Inventors: Hari Om, Santa Clara, CA (US); Andrew Wright, Fremont, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 162 days.

(21) Appl. No.: 11/014,123

(22) Filed: Dec. 15, 2004

(51) Int. Cl.
G11C 15/00 (2006.01)

(52) U.S. Cl. .................. 365/49; 365/210; 365/230.03; 711/108

(58) Field of Classification Search .................. 365/49, 365/210, 230.03; 711/108
See application file for complete search history.

(56) References Cited

U.S. PATENT DOCUMENTS

| | | |
|---|---|---|
| 5,383,146 A | 1/1995 | Threewitt |
| 5,440,715 A | 8/1995 | Wyland |
| 5,446,686 A | 8/1995 | Bosnyak et al. |
| 5,448,733 A | 9/1995 | Satoh et al. |
| 5,602,764 A | 2/1997 | Eskandari-Gharnin et al. |
| 5,852,569 A | 12/1998 | Srinivasan et al. |
| 5,859,791 A | 1/1999 | Schultz et al. |
| 5,870,324 A | 2/1999 | Helwig et al. |
| 5,999,435 A | 12/1999 | Henderson et al. |
| 6,081,440 A | 6/2000 | Washburn et al. |
| 6,108,227 A | 8/2000 | Voelkel |
| 6,195,277 B1 | 2/2001 | Sywyk et al. |
| 6,240,000 B1 | 5/2001 | Sywyk et al. |
| 6,253,280 B1 | 6/2001 | Voelkel |
| 6,266,262 B1 | 7/2001 | Washburn et al. |
| 6,374,325 B1 | 4/2002 | Simpson et al. |
| 6,480,406 B1 | 11/2002 | Jin et al. |
| 6,502,163 B1 | 12/2002 | Ramankutty |
| 6,504,740 B1 | 1/2003 | Voelkel |
| 6,505,270 B1 | 1/2003 | Voelkel et al. |
| 6,515,884 B1 | 2/2003 | Sywyk et al. |
| 6,538,911 B1 | 3/2003 | Allan et al. |
| 6,542,391 B1 | 4/2003 | Pereira et al. |
| 6,647,457 B1 | 11/2003 | Sywyk et al. |
| 6,661,716 B1 | 12/2003 | Sywyk et al. |
| 6,697,275 B1 | 2/2004 | Sywyk et al. |
| 6,721,202 B1 | 4/2004 | Roge et al. |
| 6,751,755 B1 | 6/2004 | Sywyk et al. |
| 6,763,425 B1 | 7/2004 | Pereira |
| 6,763,426 B1 | 7/2004 | James et al. |
| 6,772,279 B1 | 8/2004 | Sun et al. |
| 6,804,744 B1 | 10/2004 | Abbas |
| 6,829,153 B1 * | 12/2004 | Park et al. ..................... 365/49 |
| 6,845,024 B1 | 1/2005 | Wanzakhade et al. |
| 6,876,558 B1 | 4/2005 | James et al. |
| 6,892,273 B1 | 5/2005 | James et al. |
| 6,903,951 B1 | 6/2005 | James |
| 6,906,936 B1 | 6/2005 | James et al. |
| 6,958,925 B1 | 10/2005 | Om et al. |
| 6,988,164 B1 | 1/2006 | Wanzakhade et al. |

(Continued)

Primary Examiner—Richard Elms
Assistant Examiner—Toan Le
(74) Attorney, Agent, or Firm—Bradley T. Sako

(57) ABSTRACT

A content addressable memory (CAM) device (200) can include a control block (202) having a dummy control circuit (216). A dummy control circuit (216) can initiate dummy searches (or other operations) prior to and/or during actual searches to reduce overall supply current transients. Methods for initiating dummy searches are also disclosed.

21 Claims, 12 Drawing Sheets

U.S. PATENT DOCUMENTS

| | | |
|---|---|---|
| 7,000,066 B1 | 2/2006 | Wanzakhade et al. |
| 7,084,672 B1 | 8/2006 | Meng et al. |
| 2003/0120979 A1 | 6/2003 | Rajamanickam |
| 2003/0235099 A1 * | 12/2003 | Mori et al. .................. 365/202 |
| 2004/0088700 A1 | 5/2004 | Lee et al. |

* cited by examiner

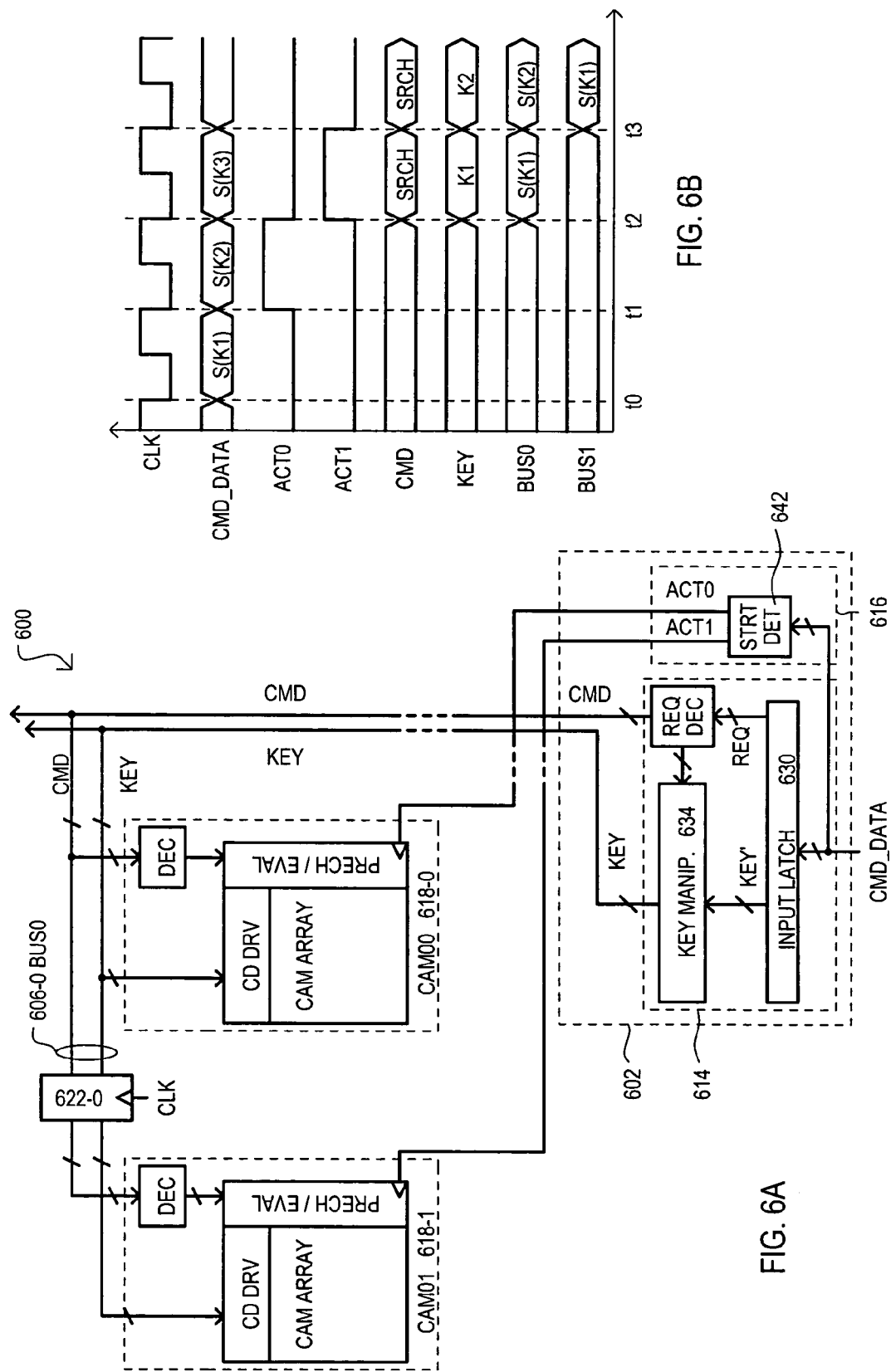

METHOD AND APPARATUS FOR SMOOTHING CURRENT TRANSIENTS IN A CONTENT ADDRESSABLE MEMORY (CAM) DEVICE WITH DUMMY SEARCHES

TECHNICAL FIELD

The present invention relates generally to content addressable memory (CAM) devices, and more particularly to the execution of operations, such as search operations, within CAM devices.

BACKGROUND OF THE INVENTION

Content addressable memory (CAM) devices, sometimes also referred to as "associative memories", can provide rapid matching functions between an applied data value (e.g., a comparand, compare data, or search key) and stored data values (e.g., entries). Such rapid matching functions are often utilized in routers, network switches, and the like, to process network packets. As but two examples, a CAM can be utilized to search access control lists (ACLs) or forwarding information bases (FIBs). As is well know, an ACL can include a set of rules (data set) that can limit access (e.g., forwarding of packets) to only those packets having fields falling within a particular range. An FIB can include data necessary for forwarding a packet, typically the generation of a "next hop" address in response to a destination address.

A typical CAM device can store a number of data values in a CAM cell array. In a compare (i.e., match) operation, entries can be compared to a compare data value. An entry that matches the compare data value can result in the generation of a match indication.

In a conventional CAM device, search operations can be conducted in response to a system clock, with searches being undertaken every clock cycle. As a result, CAM devices can draw considerable current as match lines in the CAM cell array are continuously charged and discharged each clock cycle.

Current draw in a CAM device can be particularly problematic in the case of a "cold start" operation. A cold start operation can occur when a CAM device switches from an idle state, in which the various CAM array sections of the device are not operational, to an active state, in which CAM array sections perform various functions, such as a search operation, or the like.

Existing conventional approaches can transition from an idle state to a full active state (e.g., search) in a single cycle. This can potentially happen on every other cycle. When a CAM device portion (e.g., a core or block) goes from an idle to an active operation, there can be a very large change in the current requirement for the device. In current and future generation parts, such a current surge may be too large for the on-chip capacitance to support and can happen too quickly for capacitors on circuit boards associated with the CAM device.

Still further, parasitic inductance of a package containing a CAM device, as well as inductance inherent in a CAM device mounting arrangement, can prevent a fast ramp up of the current, preventing an adequate current supply from being provided when needed by the CAM device.

The above deficiencies can result in a power supply voltage "sag" (i.e., level dip) within the CAM device. In addition, the rapid change in current (dI/dt) through parasitic inductive elements can give rise to ground "bounce" (transient jump in a low supply voltage level), which can further disturb CAM operations. These undesirable variations in supply voltages can lead to failures. Such failures are often referred to as "cold start" failures or problems.

To better understand various feature and advantages of the disclosed embodiments of the present invention, examples of other CAM device cold start operations will now be described with reference to FIGS. 12A and 12B.

FIG. 12A is a block diagram of one approach for reducing overall transient current in a CAM device. In the arrangement of FIG. 12A, a CAM device 1200 can be divided into two halves 1202-0 and 1202-1, with each half performing a search on opposite edges of a clock signal, and provide results to a synchronizer/priority encoder 1204. In particular, on one type of clock transitions (e.g., low-to-high), one side 1202-1 (Panel B) can precharge match lines, while the other side 1202-0 (Panel A) evaluates (i.e., compares a search key to data in CAM entries). On the other clock transition (e.g., high-to-low), the two sides operate in the opposite fashion.

As shown in FIG. 12B, such an arrangement can help to spread out current demand within a cycle. FIG. 12B is a timing diagram showing an average current (I) drawn over time. By providing "intra-clock" activation, power supply transients within one clock cycle can be smoothened.

However, as CAM devices increase in capacity and operating speed, such an approach may not be sufficient to eliminate cold start and related problems. In particular, for higher capacity devices, in the above arrangement, current surges on each clock edge can cause a low power supply level to rise and a high power supply level to sag.

Thus, while the above approach may provide some relief on peak current draw within a single cycle for relatively slower and/or smaller CAM devices, such an arrangement may not address larger CAM devices, or inter cycle current demands or multi-cycle current transients.

Examples of approaches to clocking different portions of CAM device are disclosed in U.S. Pat. No. 6,240,000, titled CONTENT ADDRESSABLE MEMORY WITH REDUCED TRANSIENT CURRENT, issued to Sywyk et al. on May 29, 2001. Another arrangement is disclosed in commonly-owned co-pending U.S. patent application Ser. No. 10/746,899, titled STAGGERED COMPARE ARCHITECTURE FOR CONTENT ADDRESSABLE MEMORY by Om et al., filed on Dec. 24, 2003. The contents of this application are incorporated by reference herein.

Various approaches for reducing a turn-on current (e.g., cold start current) in a CAM device by sequentially activating sections, and sequentially activating blocks within each section is shown in commonly-owned co-pending U.S. patent application Ser. No. 10/940,129, titled REDUCED TURN-ON CURENT CONTENT ADDRESSABLE MEMORY (CAM) DEVICE AND METHOD by Narum et al., filed on Sep. 14, 2004. This application also describes in greater detail examples of cold start errors. This application is incorporated by reference herein.

In light of the above, it would be desirable to arrive at some way of reducing the current drawn by a CAM device when transitioning from a low activity state (e.g., idle) to a high activity state (e.g., search).

It would also be desirable to arrive at some way of smoothening current transients over multiple operating cycles of a CAM device.

It would be desirable if such arrangements did not decrease overall throughput of the CAM device.

SUMMARY OF THE INVENTION

The present invention includes a content addressable memory (CAM) device having a plurality of CAM blocks, each CAM block comprising a plurality of CAM entries and having an active mode that consumes more current than an idle mode. A command control block can receive command data, and a dummy control circuit coupled to at least one CAM block can initiate a dummy operation (e.g., dummy search) in response to selected command data prior to an actual operation (e.g., actual search) corresponding to the command data.

Such an arrangement can reduce current transients when a CAM device switches from an idle mode to an active mode, by gradually activating CAM blocks over time.

According to one aspect of the embodiments, command data can include a search command and a search key. In addition, a control circuit can initiate a dummy search operation in a CAM block in response to the search command, and prior to an actual search key being applied to the CAM block. This can happen by sensing a valid search instruction ahead of time and executing a dummy search operation in a portion of a CAM array before an actual search is executed.

In this way, dummy search operations can precede actual search operations to provide for a gradual turn-on of CAM blocks within the CAM device.

According to another aspect of the embodiments, a CAM blocks can be divided into at least a first section and second section. A dummy control circuit can prevents a dummy search command from propagating to a second section, while allowing actual search commands to propagate to the second section.

In this way, dummy search operations can be initiated by selective application of a search command to selective CAM blocks.

According to another aspect of the embodiments, a command control block can include a decoder that generates a dummy search command. A dummy control circuit can include a block command decoder coupled to selected CAM blocks. Each block command decoder can activate a respective CAM block in response to a dummy search command.

In this way, dummy search operations can be initiated by "targeted" dummy search commands executed only by selected CAM blocks.

According to another aspect of the embodiments, a command control block can include a decoder coupled to receive command data. In response to a search request in the command data, a control block can issue a dummy search command followed by an actual search command corresponding to the search request.

According to another aspect of the embodiments, a dummy control circuit can include a dummy signal activation circuit that activates at least one dummy activation signal in response to a search request in the command data. In addition, an activation circuit can be coupled to at least one CAM block. Each activation circuit can activate the respective CAM block in response to the at least one dummy activation signal.

In this way, dummy searches can be initiated by control signals separate from a search command.

According to another aspect of the embodiments, the plurality of CAM blocks includes at least four CAM blocks. In addition, a command control block receives command data according to a periodic clock signal, and in response to a sequence of search requests, activates a first CAM block in a first search cycle and more than two CAM blocks in a second search cycle. A dummy control circuit can activate one CAM block with a dummy operation prior to the first search cycle and a second CAM block with a dummy operation in the first search cycle.

According to another aspect of the embodiments, the plurality of CAM blocks includes at least six CAM blocks. A command control block receives command data according to a periodic clock signal, and in response to a sequence of search requests activates a first CAM block in a first search cycle and activates first, second and third CAM blocks in a second search cycle. In addition, a dummy control circuit activates one CAM block with a dummy search two cycles prior to the first search cycle and activates two CAM blocks with a dummy operation one cycle prior to the first search cycle.

According to another aspect of the embodiments, the plurality of CAM blocks are arranged into a plurality of sections, each section including at least a first CAM block and a second CAM block separated by an activation control circuit. Each activation control circuit can selectively activate CAM entries in the corresponding second CAM block based on search results of a corresponding entry in the first CAM block.

In this way, additional reduction in current transients can be achieved, as a second CAM block can typically activate fewer CAM entries than the first CAM block.

The present invention can also include a CAM device having a plurality of sections. A first section can include a first CAM block coupled to a first command data bus and a second CAM block coupled to the first command data bus by first block register. Similarly, a second section can include a second command data bus coupled to the first command data bus by a first section register, a third CAM block coupled to the second command data bus, and a fourth CAM block coupled to the second command data bus by second block register. A control block can receive search command data, and in response to a search request, output a dummy search command that does not generate valid search result data. The control block may subsequently output an actual search command that generates valid search result data.

According to one aspect of the embodiments, a first section can include a first section priority encoder having a first input coupled to a result output of the first CAM block by a first output register, and a second input coupled to a result output of the second CAM block. A second section can include a second section priority encoder having a first input coupled to a result output of the third CAM block by a second output register, and a second input coupled to a result output of the fourth CAM block.

According to another aspect of the embodiments, a CAM device can include a global priority encoder having a first input coupled to an output of the first section priority encoder by a first priority encoder register, and a second input coupled to an output of the second section priority encoder.

According to another aspect of the embodiments, a first block register, first section register, and second block register noted above can be commonly controlled by a same clock signal.

The present invention can also include a method of activating a CAM device in response to command data. The method can include (a) receiving at least one command; (b) sequentially activating an increasing number of CAM blocks in a sequence according to the at least one command; and (c) activating at least one CAM block prior to the start of the sequence and during the sequence according to a dummy activation operation that does not generate valid output data from the respective CAM block.

According to one aspect of the embodiments, receiving a command can further include decoding command data, sensing a search instruction ahead of time, and generating the dummy search command for one clock cycle, and generating an actual search command on the next clock cycle.

According to another aspect of the embodiments, receiving a command can further include receiving a series of consecutive search commands. Each step of the sequence can occurs in one clock cycle. In addition, only one CAM block is switched to an active state in a given clock cycle until all the CAM blocks are in the active state.

According to another aspect of the embodiments, activating a CAM block according to a dummy operation can include issuing a dummy search to selected CAM blocks, and not to other CAM blocks.

According to another aspect of the embodiments, activating a CAM block according to a dummy operation can include issuing a dummy search, and activating selected CAM blocks in response to the dummy search, while not activating other CAM blocks in response to the dummy search.

According to another aspect of the embodiments, activating a CAM block according to a dummy operation can include generating a plurality of dummy activation signals, at least a first activation signal being activated prior to the search sequence. In addition, a different CAM block can be activated in response to each dummy activation signal.

According to another aspect of the embodiments, the method can also include logically arranging CAM blocks into sections including at least a first CAM block and a second CAM block. In addition, the method can include, in a search operation, sequentially applying a search key to each section, and within each section, applying a first portion of the search key to the first CAM block and a second portion of the search key to the second CAM block.

BRIEF DESCRIPTION OF THE DRAWINGS

FIG. 6A is a block schematic diagram showing another example of a dummy control circuit arrangement according to one embodiment. FIG. 6B is a timing diagram showing the operation of the arrangement in FIG. 6A.

DETAILED DESCRIPTION

Various embodiments of the present invention will now be described in detail with reference to a number of drawings. The embodiments include a content addressable memory (CAM) device and operating method that can alleviate current transients occurring over multiple operational cycles by sensing an actual search instruction ahead of time, and then activating portions (e.g., blocks) of the CAM device according to a dummy operation (e.g., a dummy search) that starts prior to an actual operation (e.g., actual search operation). As will be understood in more detail by the various described embodiments, a "dummy" operation can cause the activation of a CAM block, but is not required to yield any valid search result data. In contrast, an "actual" search can search the corresponding CAM block and yield valid data for such a search.

Figure 1A:
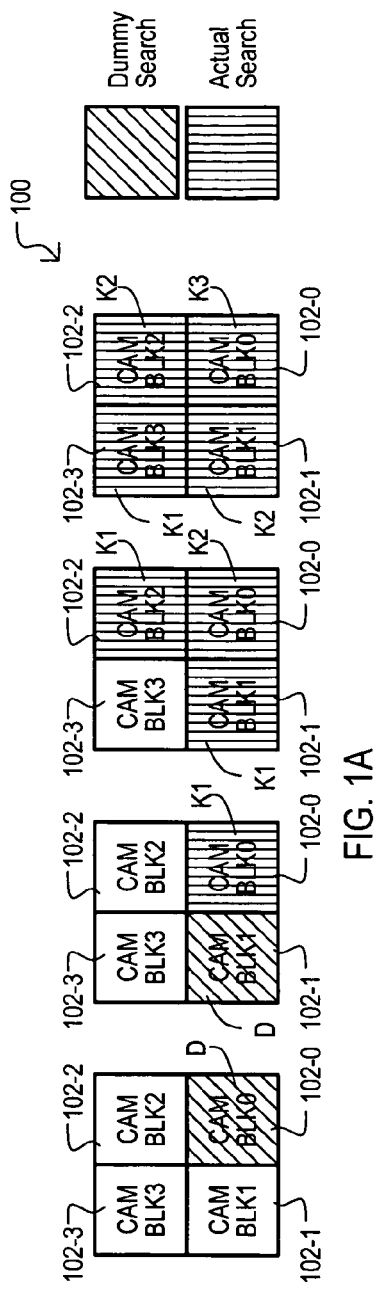
FIG. 1A is a sequence of block diagrams of a CAM device and operation method according to a first embodiment of the present invention.
Figure 1B:
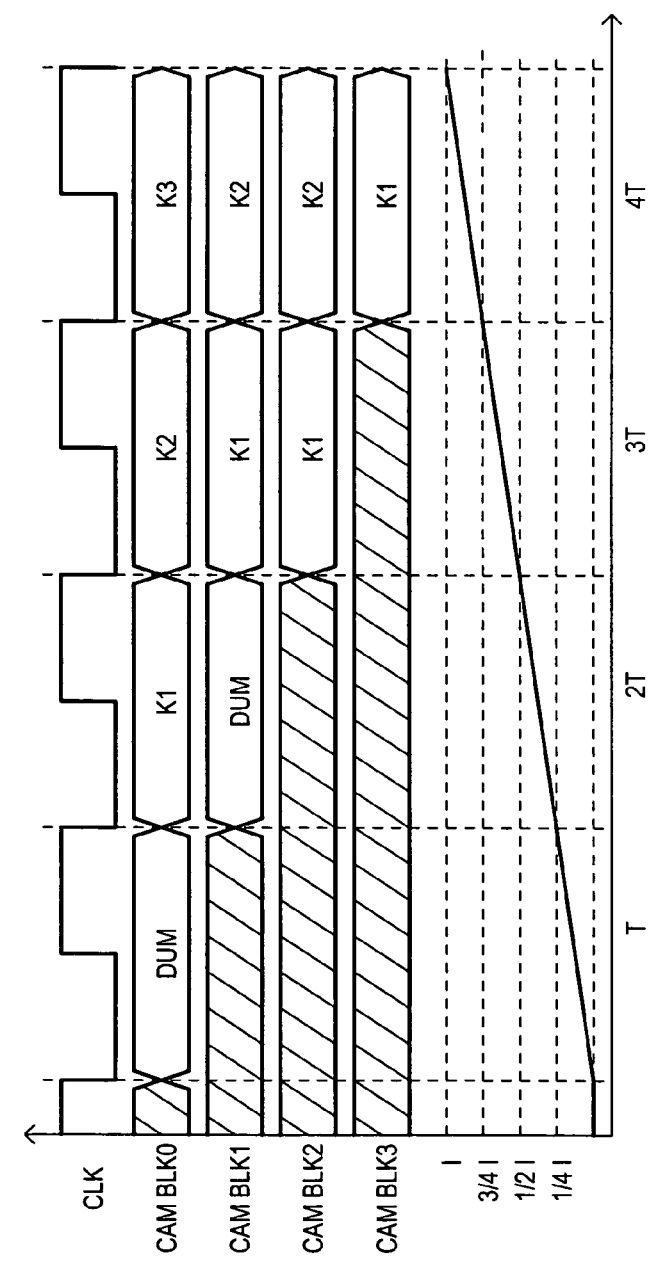
FIG. 1B is a timing diagram showing the operation of FIG. 1A.

A CAM device and corresponding method of operation according to a first embodiment are shown in FIGS. 1A and 1B. FIG. 1A shows an operation resulting from back-to-back (pipelined) searches with three search keys K1 to K3. FIG. 1B is a timing diagram showing an average current drawn by the CAM device of FIG. 1A, as well as the operation being undertaken by each CAM block of the CAM device.

FIG. 1A is a sequential representation of a CAM device 100 as it undergoes search operations according to keys K1 to K3. Each view of the CAM device 100 corresponds to the clock cycle directly below in the timing diagram of FIG. 1B. The particular CAM device 100 of FIG. 1A includes four CAM blocks 102-0 to 102-3 (BLK0 to BLK3).

Unlike conventional CAM devices, in CAM device 100, CAM blocks can undergo "dummy" search operations in addition to actual search operations once a valid search operation is sensed ahead of time. In FIG. 1A, a dummy search of a given CAM block is shown by diagonal hatching, while an actual search of CAM block is shown by vertical hatching. It is assumed that a search operation is sensed one cycle ahead.

The inclusion of such dummy searches can limit current transients by ensuring that CAM blocks are activated gradually. Preferably, only one CAM block is turned on in any clock cycle, but the present invention should not necessarily be construed as limited to such an arrangement. It is understood that a CAM block can be a minimum increment of controllable CAM.

Referring now to FIG. 1A in conjunction with FIG. 1B, in a first cycle T, CAM block 102-0 can be subject to a dummy search. That is, prior to an actual search being applied to any CAM block (102-0 to 102-3), a dummy search is performed. It is understood that at this time, a search request for a first key K1, may have already been received, but may still be being processed. This is shown in FIG. 1B by CAM block 102-0 having diagonal shading.

In a second cycle 2T an actual search sequence can begin. Thus, a first search key K1 can be searched in CAM block 102-0. However, at the same time, a dummy search can occur in another, different CAM block 102-1. In this way, while an actual search is being performed within the CAM device 100, dummy searches can be performed as well, to thereby smoothen transient currents. This is shown in FIG. 1B by CAM block 102-1 having diagonal hatching, and CAM block 102-0 having vertical hatching and the designation K1 (for search key K1).

In the very particular example of FIG. 1B, in cycle 3T, dummy searches can cease, and the CAM device can operate according to actual searches until the CAM device is completely active (all CAM blocks activated). Thus, in this cycle, key K1 can continue to be searched in CAM blocks 102-1 and 102-2, while a newly arrived key K2 can be searched in CAM block 102-0.

In cycle 4T, a CAM device 100 can be fully active with key K1 being searched in CAM block 102-3, key K2 being searched in CAM blocks 102-1 and 102-2, and newly arrived key K3 can be searched in CAM block 102-0.

If reference is made to FIG. 1B, it is seen that current can increase over the four operating cycles (T to 4T) at a relatively gradual rate, increasing by about (1/4)I every cycle, where I is a differences between the current drawn when the CAM device is completely active, versus when the CAM device is completely idle.

Looked at in another way, in the absence of any dummy searches, the number of CAM blocks activated in response to the three sequential searches would be one block in a first cycle, then three blocks in the next cycle, and then four blocks. That is, the block activation sequence is "1, 3, 4", which would mean a peak current change of I/2 and an average current change of I/3 in a cycle. According to the embodiment shown, dummy searches can be added so that only one additional block is activated every cycle, for an activation sequence of "1, 2, 3, 4", which would mean both a peak current change and an average current change of I/4 in a cycle.

Figure 2:
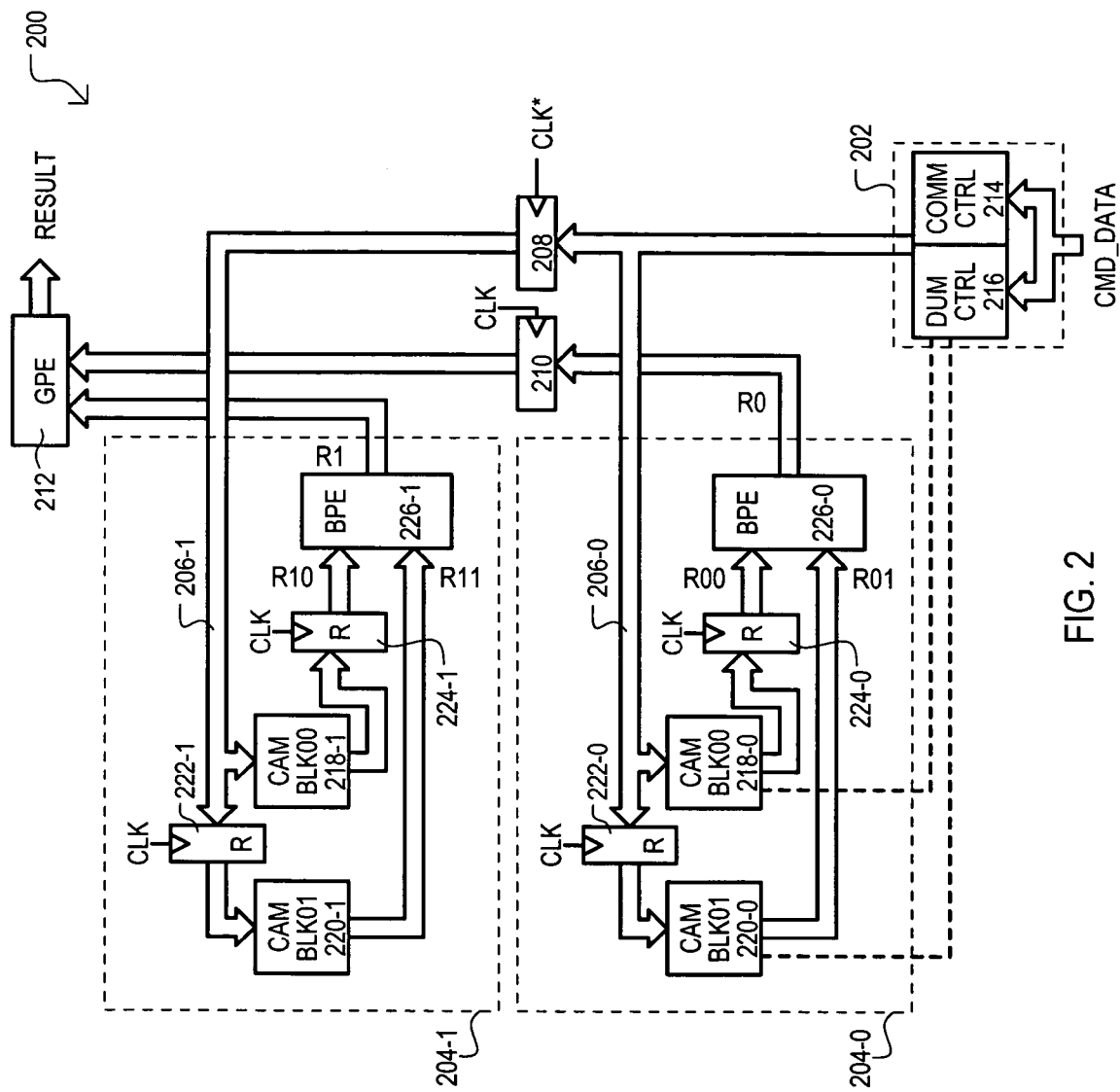
FIG. 2 is a block schematic diagram of a CAM device according to a second embodiment of the present invention.

Referring now to FIG. 2, a CAM device according to a second embodiment is set forth in a block schematic diagram and designated by the general reference character 200. A CAM device 200 can include a control block 202, a first section 204-0, a second section 204-1, a first command data bus 206-0, a second command data bus 206-1, a section register 208, and output register 210, and a global priority encoder 212.

In response to received command data, a control block 202 can output operation control data, including search keys and the like, onto first command data bus 206-0. A first section 204-0 can receive such operation control data, and in response, generate result data that can be stored in output register 210. Operational control data on first command bus 206-0 can be stored in section register 208, and then output onto second command data bus 206-1 according a clock signal CLK. Second section 204-1 can receive such operation control data, and in response, generate result data that can be output to global priority encoder 212. At the same essential time, result data for the same operation can be output from output register 210 to global priority encoder 212.

Global priority encoder 212 can provide an "overall" result (RESULT) as an output.

A control block 202 can include a command control circuit 214 and a dummy control circuit 216. A command control circuit 214 can receive command data, such as search request and search keys, and in response thereto, issue command data on first command data bus 206-0. A dummy control circuit 216 can sense a valid search instruction ahead of time and initiate dummy operations prior to and/or during actual searches. Various examples of dummy control circuits will be described at a later point herein. For this reason, some lines output from dummy control section 216 are shown in dashed form, as such lines may not be included in some embodiments.

In the particular example of FIG. 2, each sections (204-0 and 204-1) has essentially the same structure, including a first CAM block 218-0/1, a second CAM block 220-0/1, a block register 222-0/1, and an output register 224-0/1. In a first section 204-0, command data can be received by a first CAM block 218-0 and stored in block register 222-0. First CAM block 218-0 can generate a result that is stored in output register 224-0. In a subsequent clock cycle, command data in block register 222-0 can be applied to second block 220-0, which can generate a result (R01) supplied to block priority encoder (P.E.) 226-0. On the same clock cycle, output register 224-0 can output stored results (R00) to block P.E. 226-0. Block P.E. 226-0 can prioritize and encode such results, to provide a section result output (R0).

Second section 204-1 operates in the same general fashion as first section 204-0. However, second section 204-1 can operate in response to command data issued from section register 208. As a result, second section 204-1 can operate with a one cycle delay with respect to first section 204-0.

Figure 3:
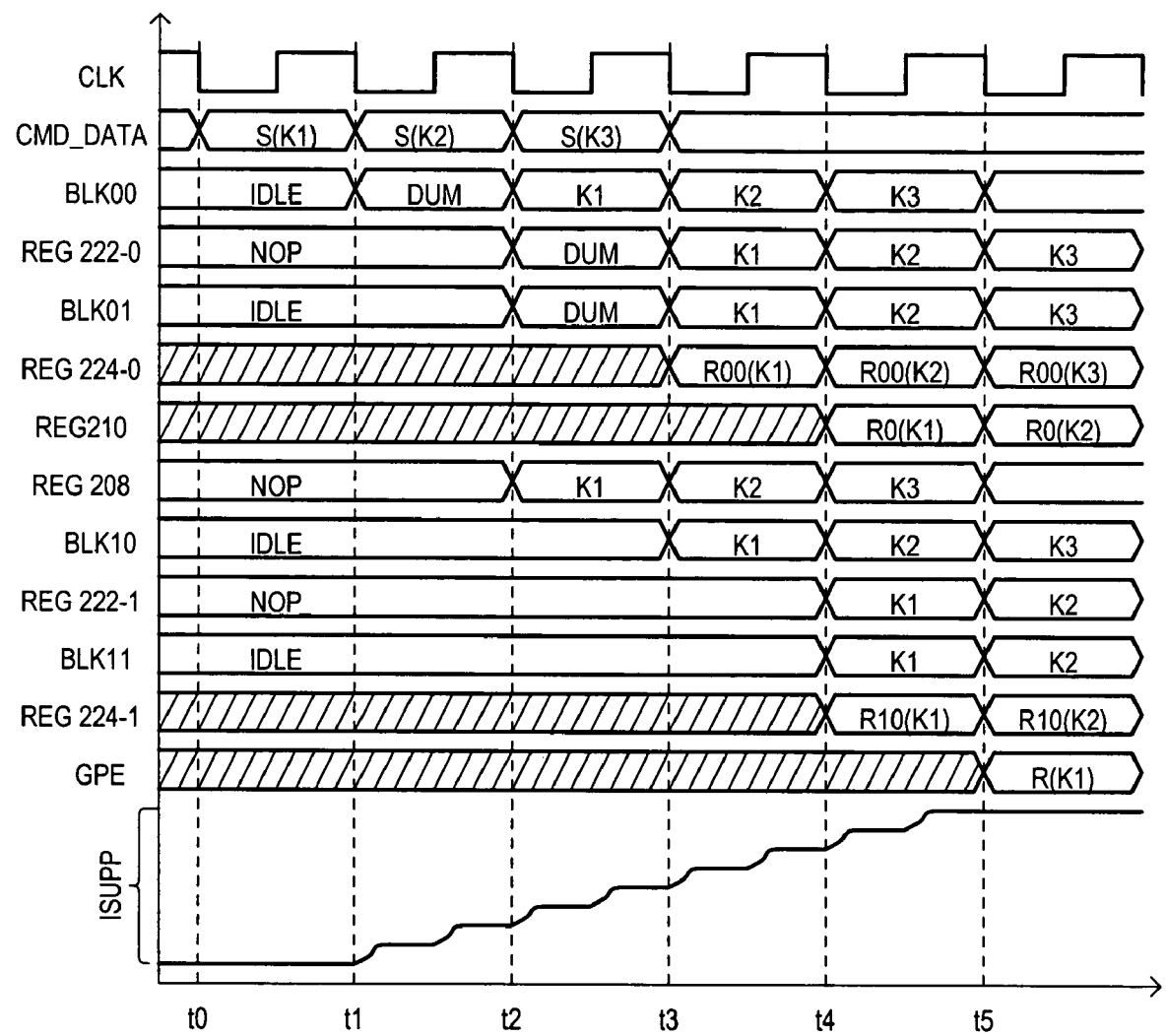
FIG. 3 is a timing diagram showing the operation of the CAM device of FIG. 2.

The operation of the CAM device 200 will now be described with reference to FIG. 2 in conjunction with FIG. 3. FIG. 3 is a timing diagram that includes waveforms for a clock signal CLK, an input to control block 202 (CMD-_DATA), CAM blocks 218-0, 220-0, 218-1 and 220-1 (shown as BLK00, -01, -10 and -11), the output of various registers shown in FIG. 2, the output of global priority encoder 212 (shown as GPE), and a supply current for the CAM device ISUPP.

Prior to time t0, a CAM device 200 can be in an overall idle state. Thus, all CAM blocks CAM00, -01, -10 and -11 can be in an idle state. In addition, in the particular arrangement shown, registers 222-0 and 222-1 can output a "no operation" NO OP command.

Between times t0 and t1, a search command for a key K1 S(K1) can be received by a control block 202.

Between times t1 and t2, in response to a search command S(K1), dummy control circuit 216 can initiate a dummy search in CAM block BLK00 (218-0). In one particular example, an activation of CAM block BLK00 can include precharging match lines and/or discharging such match lines. At the same time, the remaining CAM blocks (BLK01, -10, -11) can remain idle. As a result, an incremental amount of the supply current ISUPP can be drawn. In addition, a next search command for key S(K2) for a key K2 can also be received at this time.

Between times t2 and t3, an actual search can start with respect to key K1. In particular, key K1 can be searched in CAM block BLK00 218-0. At the same time, however, dummy control circuit 216 can initiate a dummy search in CAM block BLK01 (220-0). At the same time, the remaining CAM blocks (BLK10 and -11) can remain idle. As a result, an incremental amount of the supply current ISUPP can be drawn once again. In addition, a next search command for key S(K3) for a key K3 can also be received at this time.

Between times t3 and t4, the actual search with key K1 can continue while the actual search of key K2 begins. In particular, key K1 can be searched in CAM blocks BLK01 and BLK10, while key K2 can be searched in CAM block BLK00. At this time dummy control circuit 216 can cease dummy searches. As such, one CAM block BLK11 can remain idle. As a result, an incremental amount of the supply current ISUPP can be drawn once again.

Between times t4 and t5, a CAM device 200 can reach a fully active state, with all CAM blocks being active. The actual searches of keys K1 and K2 can continue, while the actual search of key K3 begins. In particular, key K1 can be searched in CAM block BLK11, while key K2 can be searched in CAM blocks BLK01 and -10, and key K3 is searched in CAM block BLK00. Dummy control circuit 216 does not initiate any dummy searches. Also at this time, a last CAM block BLK11 goes into an active state. As a result, an incremental amount of the supply current ISUPP can be drawn and a supply current can reach a "fully" active state.

Figure 12A:
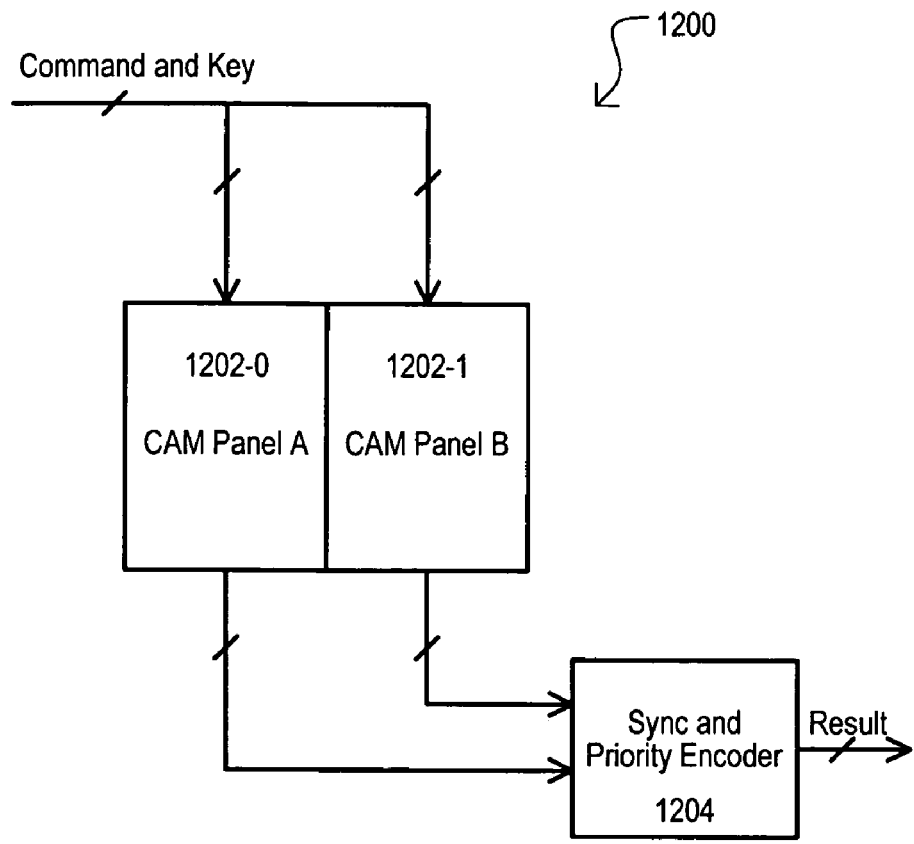
FIG. 12A is block schematic diagram of a CAM device having halves that operate on alternate edges of a clock signal.
Figure 12B:
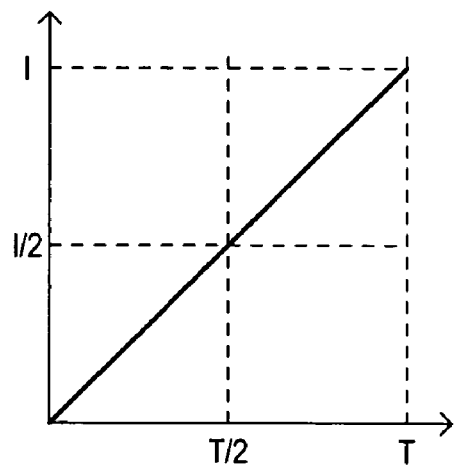
FIG. 12B is a timing diagram showing the operation of the CAM device of FIG. 12A.

As can be understood by reference to FIG. 3, current transients can be minimal with respect to a case like that of FIG. 12B.

In addition, while the above arrangement results in an additional latency between an applied command and corresponding result data, there is no loss in throughput, as a result can be generated each cycle.

Having described a CAM device 200 that can include a dummy control circuit, various examples of dummy control circuits will now be described with reference to FIGS. 4A to 6B.

Figure 4B:
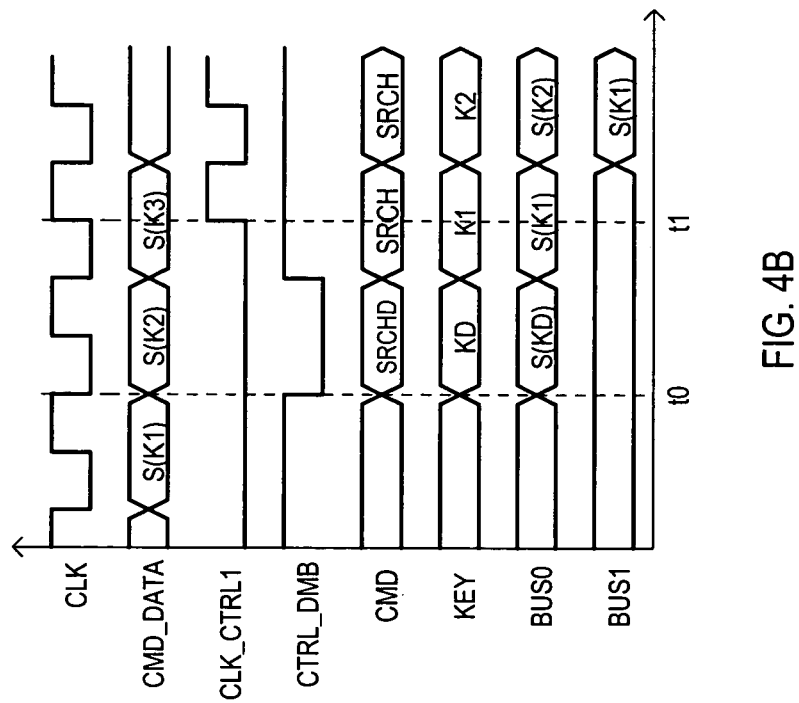
FIG. 4B is a timing diagram showing the operation of the arrangement in FIG. 4A.
Figure 4A:
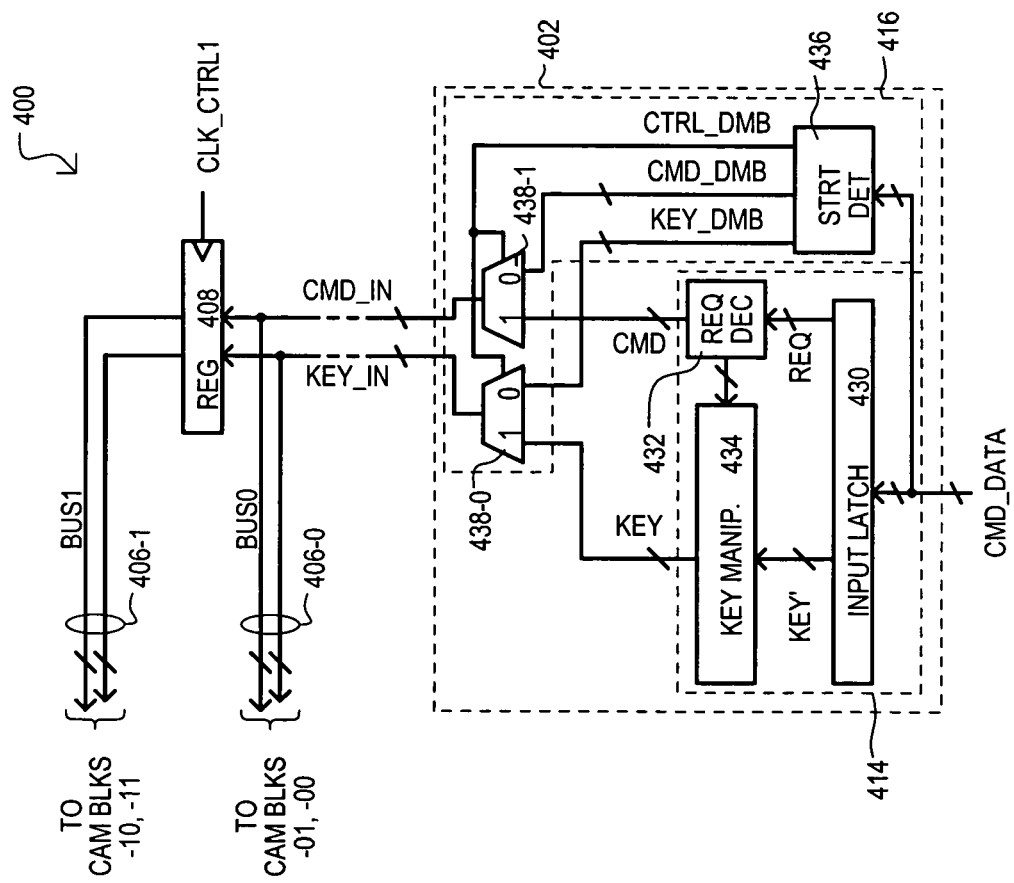
FIG. 4A is a block schematic diagram showing one example of a dummy control circuit arrangement according to one embodiment.

A first dummy control circuit example is shown in FIGS. 4A and 4B. FIG. 4A is a block schematic diagram of a control block 402 that includes a command control circuit 414 and a dummy control circuit 416. A command control circuit 414 can include an input latch 430 that can capture command data CMD_DATA. Such data can include a request portion REQ that specifies a particular operation to be performed in the CAM, as well as a "raw" key value KEY'. Request data REQ can be decoded in decoder 432 to generate a command value CMD and control signals for a key manipulation circuit 434. A key manipulation circuit 434 can generate a search key value KEY from raw key value KEY'.

An input command and input data value (CMD_IN and KEY_IN) can be applied to one set of CAM blocks (00 and 01) by way of a first command data bus BUS0 406-0, and to section register 408. Section register 408 can be controlled by a control clock signal CLK_CTRL1.

A dummy control circuit 416 can include a start detect circuit 436 and dummy multiplexers (MUXs) 438-0 and 438-1. A start detect circuit 436 can essentially "look ahead" at an incoming request in order to generate a dummy search command (CMD_DMB) and a dummy key (KEY_DMB) prior to an actual search. In the case of FIG. 4A, a start detect circuit 436 can generate a MUX control signal CTRL_DMB having an active low level. In this way, in response to a valid search request, dummy MUXs (438-0 and 438-1) can issue a dummy search command (CMD_DMB) and a dummy key (KEY_DMB) prior to an actual search.

Such an operation is shown in the timing diagram of FIG. 4B.

As shown in FIG. 4B following the reception a search request for a key K1 "S(K1)" at time t0, start detect circuit 436 can generate a dummy search request (SRCHD) and dummy search key (KD). In addition, start detect circuit can drive MUX control signal CTRL_DMB low, thus allowing a dummy search (S(KD)) to be issued on BUS0. In addition, at this time, a control clock signal CLK_CTRL1 can be low, effectively disabling section register 408. Thus, while a dummy search key K(D) and command are issued to CAM blocks BLK00 and -01, such a dummy search is not issued to CAM blocks BLK10 and -11.

After an actual search key and command are received on a first command data bus 406-0, at time t1, clock control signal CLK_CTRL1 can return high, enabling section register 408. As a result, actual search key and command S(K1) can be allowed to propagate to CAM blocks BLK10 and -11.

Figures 5A, 5B:
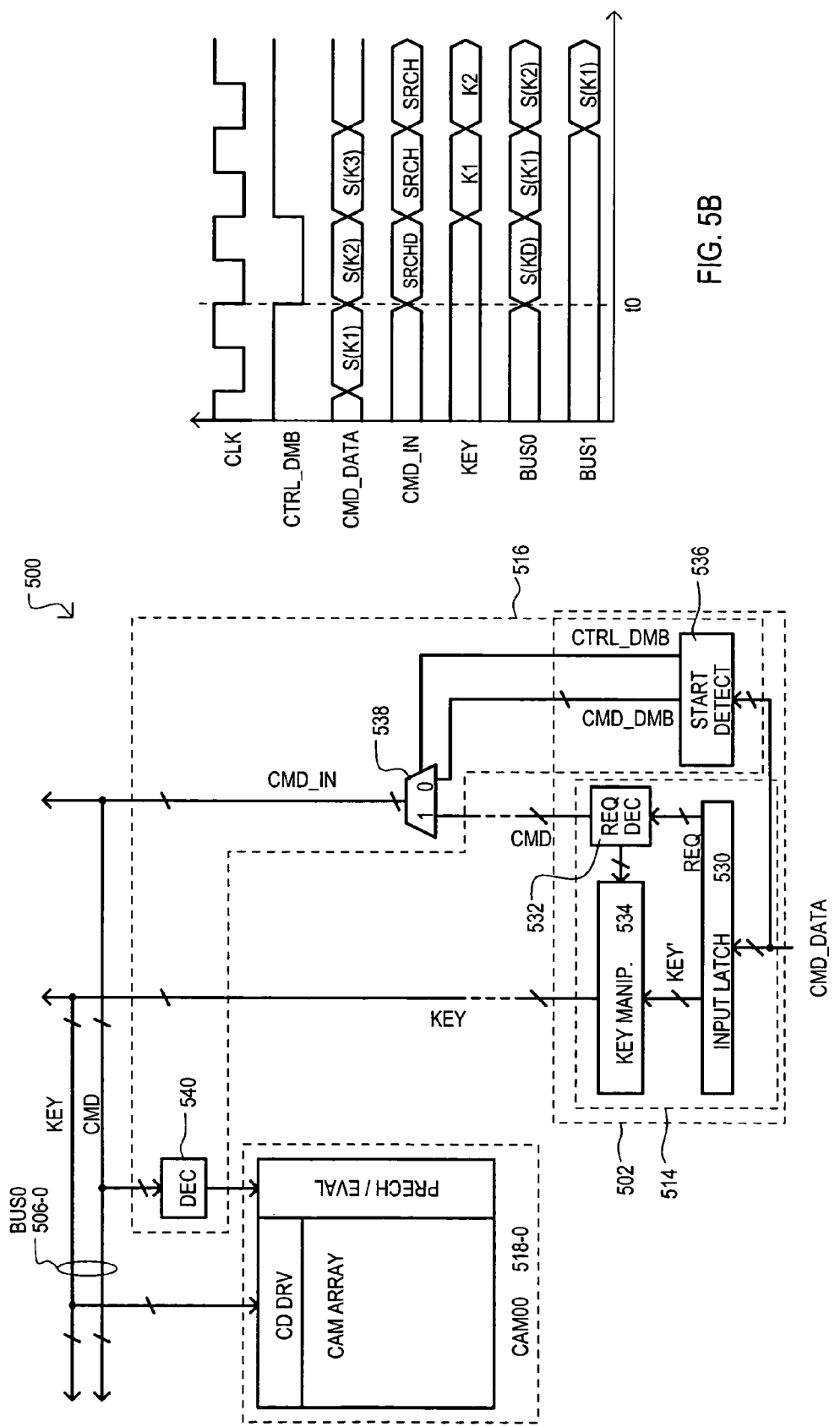
FIG. 5A is a block schematic diagram showing another example of a dummy control circuit arrangement according to one embodiment.
FIG. 5B is a timing diagram showing the operation of the arrangement in FIG. 5A.

A second dummy control circuit example is shown in FIGS. 5A and 5B. In this example, dummy searches are executed according to targeted search commands. A targeted dummy search command can be locally decoded in a block command decoder 540. Thus, unlike the arrangement of FIGS. 4A and 4B, such dummy search commands can propagate to all CAM blocks, but are executed only by targeted CAM blocks in order arrive at a desired dummy activation sequence.

One particular example for selectively accessing CAM portions (e.g., segments, or blocks) is described in commonly-owned, co-pending U.S. patent application Ser. No. 10/264,667, titled CONTENT ADDRESSABLE MEMORY (CAM) DEVICE HAVING SELECTABLE ACCESS AND METHOD THEREFOR, by James et al., filed on Oct. 4, 2002. The contents of this application are incorporated by reference herein.

A third dummy control circuit example is shown in FIGS. 6A and 6B. In this example, CAM blocks can be activated according to activation signals ACT0 and ACT1. Thus, in this arrangement, a request start detector 642 can generate one or more activation signals prior to an actual search command and key being output from command control circuit 614. Thus, unlike the arrangement of FIGS. 4A to 5B, such dummy search commands can be initiated independent of a command data bus. Of course, the arrangement of FIG. 6A could utilize a single activation signal ACT0, which can be applied to second CAM block 520-1 by a clocked register, or the like.

Of course all of the above dummy control circuits are but examples, and should not necessarily be construed as limiting the invention thereto.

While the above examples have described arrangements in which dummy searches can be used in start-up operations (such as a "cold" start), such techniques may likewise be employed as a device returns to an idle state. One such arrangement is shown in FIGS. 7A and 7B.

Figure 7A:
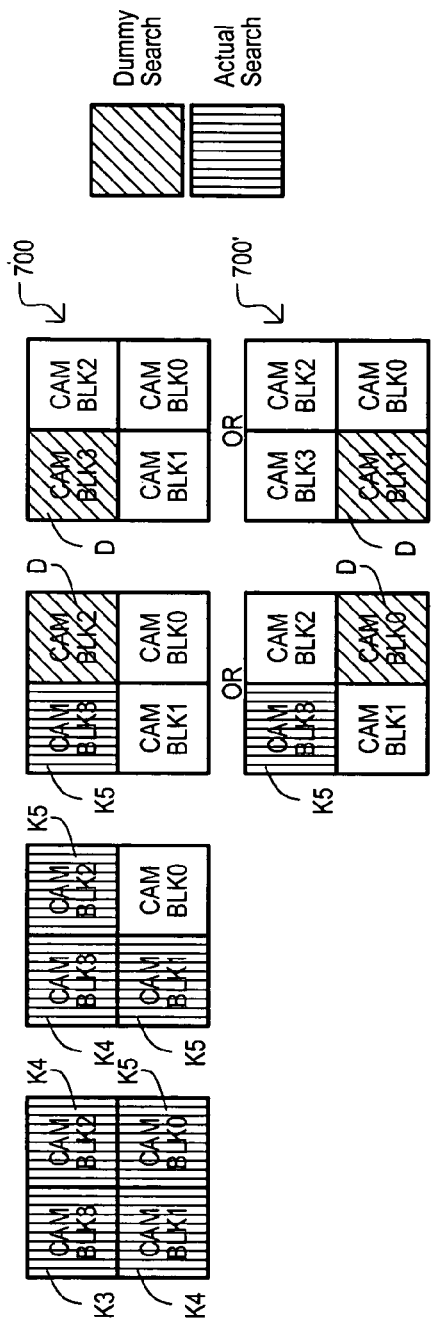
FIG. 7A is a sequence of block diagrams of a CAM device and operation method according to a third embodiment of the present invention.
Figure 7B:
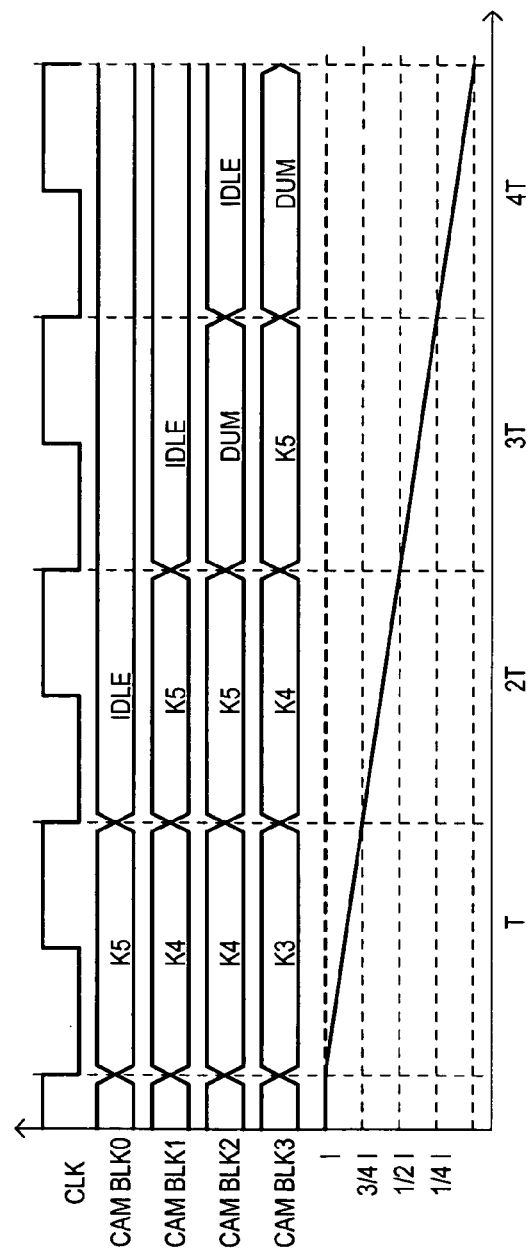
FIG. 7B is a timing diagram showing the operation of FIG. 7A.

FIGS. 7A and 7B show the same general structures as FIGS. 1A and 1B. Thus, in cycle T, a CAM device 700 can be fully active, performing searches in all CAM blocks (BLK0 to BLK3).

In cycle 2T, no search (or a high current drawing command) has been received, and CAM block BLK0 is idle. As a result, there is drop in the current I.

In cycle 3T, only CAM block BLK3 is performing an actual search. However, in order to reduce the transient current, one CAM block is subjected to a dummy search. Two examples are shown in FIG. 7A in cycles 3T and 4T. The bottom examples of the CAM device 700' demonstrate how the same dummy activation sequence shown in FIG. 1A used in a ramp-up operation can be advantageously used in a ramp-down operation. The top examples for cycles 3T and 4T show how different dummy searches can be used for ramp-up and ramp-down operations, providing a more even exercise of the CAM blocks.

It is understood that dummy searches can be initiated in the CAM blocks in a ramp-down operation in the same general fashion as the ramp-up operation.

In this way, current transients can also be reduced as a device switches from an active state to an idle state. This can alleviate, surges in power supply levels that can arise from inherent inductance in a package and/or package mounting, which can also contribute to reliability failures from gate oxide breakdown and/or electromigration, as described in more detail in Narum et al.

Another embodiment of a CAM device will now be described with reference to FIG. 8. A CAM device 800 can have many of the same circuit sections as the embodiment shown in FIG. 2. The CAM device 800 can differ from that of FIG. 2 in that it can "split" command and data buses 844-0 and 844-1 that apply different portions of one search key to different CAM blocks.

Figure 8:
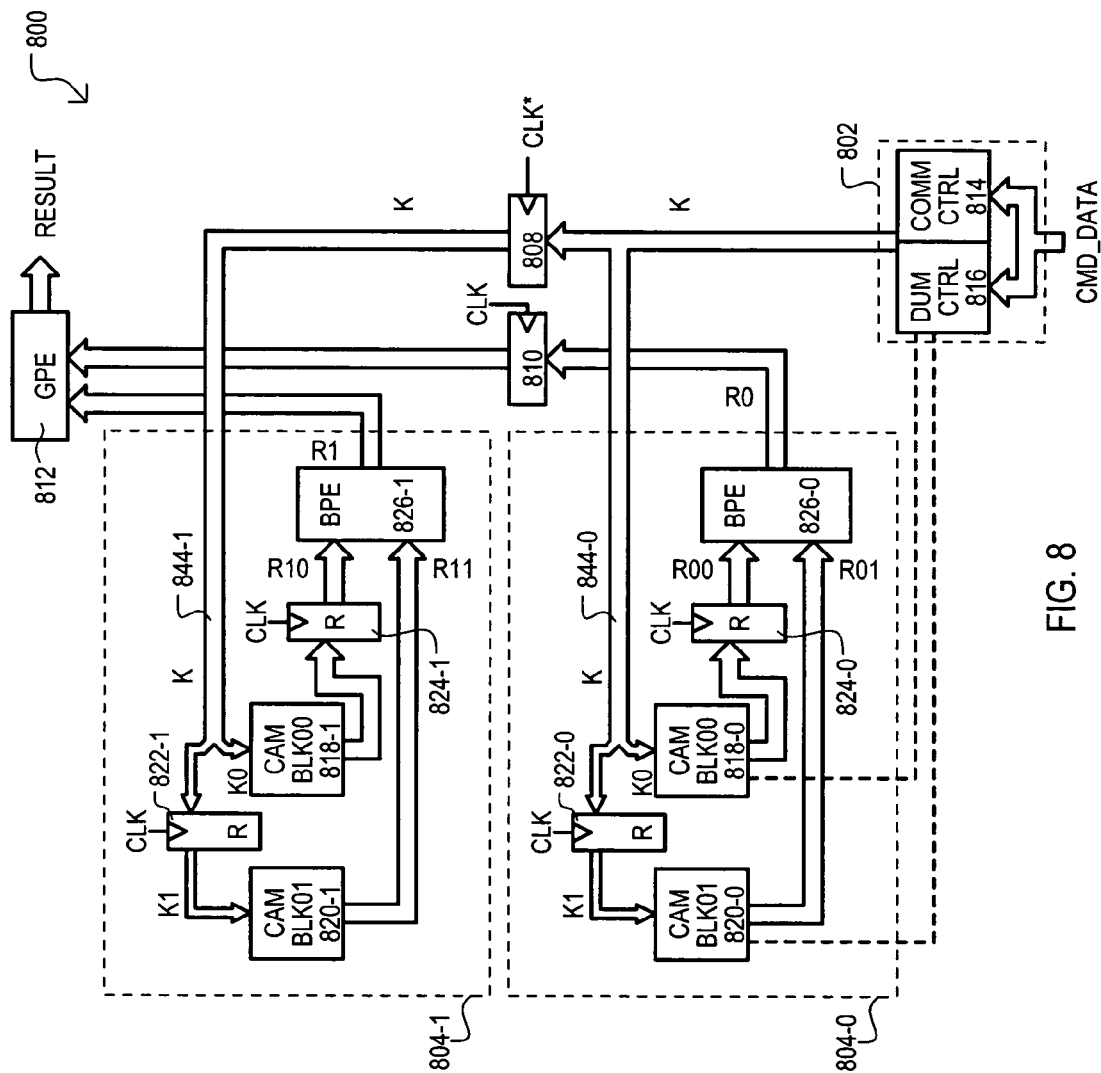
FIG. 8 is a block schematic diagram of a CAM device according to a fourth embodiment of the present invention.

More particularly, as shown in FIG. 8, in a search operation, a search key (K) may be issued from control block 802. However, only a first portion (K0) of search key (K) can be applied to first CAM blocks 818-0/1, while only a second portion (K1) of the same search key (K) can be applied to second CAM blocks 820-0/1.

In this way, current transients may be further reduced by spreading activation for one search key over a longer period of time.

Figure 9:
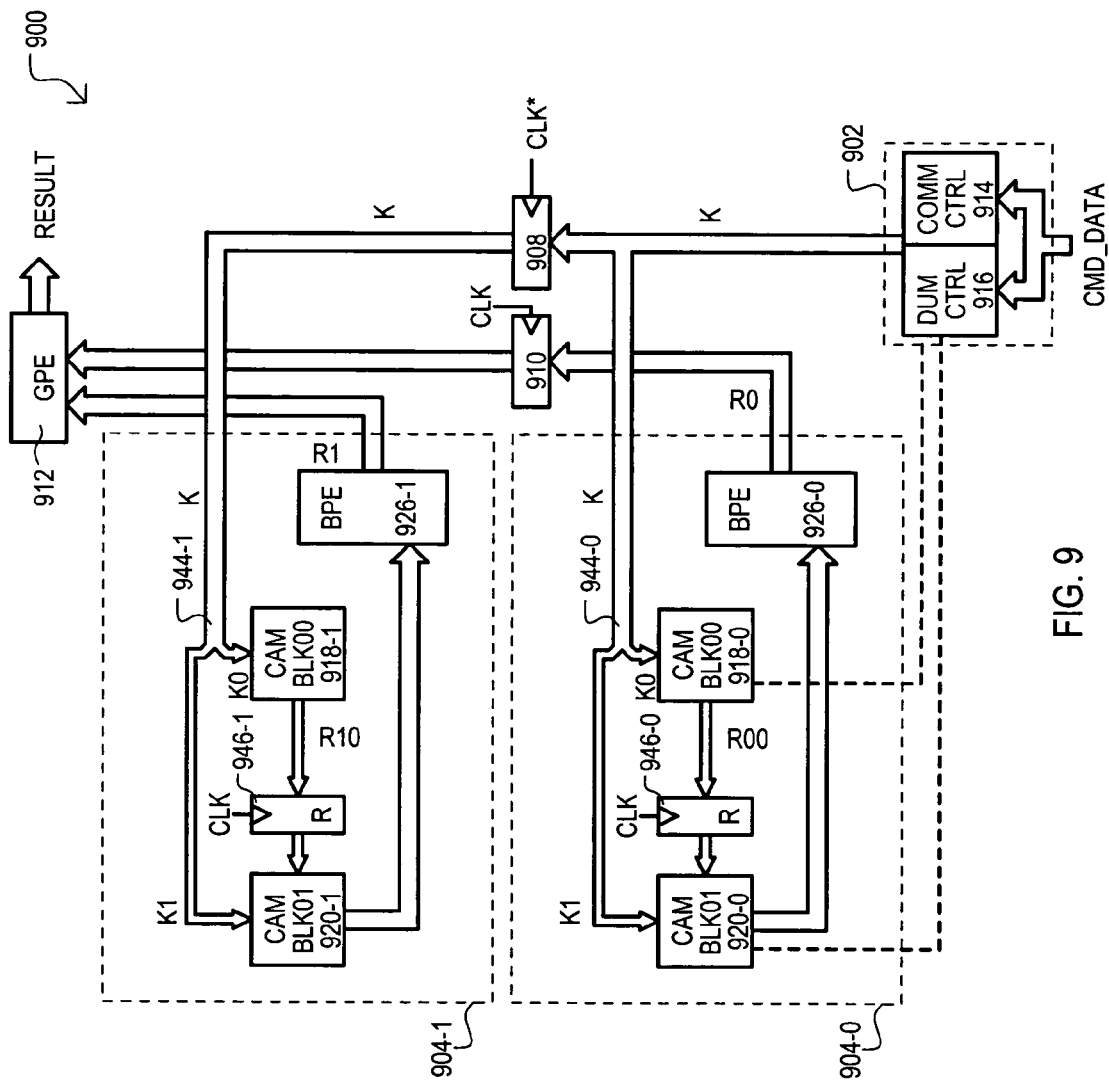
FIG. 9 is a block schematic diagram of a CAM device according to a fifth embodiment of the present invention.

Yet another embodiment of a CAM device will now be described with reference to FIG. 9. A CAM device 900 can have many of the same circuit sections as the embodiment shown in FIG. 8. The CAM device 900 can differ from that of FIG. 8 in that first CAM blocks 918-0/1 can be separated from corresponding second CAM blocks 920-0/1 by conditional enable register circuits 946-0/1. A conditional enable register circuit 946-0/1 can condition the activation of one CAM block entry upon results of the other. Thus, in the arrangement of FIG. 9, partial compare results (results from key portion K0) generated in a first CAM block (e.g., 918-0) can inhibit the search of selected entries with key portion K1 in the second CAM block (e.g., 920-0).

Very particular examples of such conditional activation of CAM blocks are shown in commonly owned co-pending U.S. application Ser. No. 10/746,899, titled STAGGERED COMPARE ARCHITECTURE FOR CONTENT ADDRESSABLE MEMORY by Om et al., filed on Dec. 24, 2003. The contents of this application are incorporated by reference herein.

In this way even greater current savings can be achieved, as conditionally searched second CAM blocks 920-0/1 will, in most applications, draw considerably less current than a CAM block that searches all entries.

As previously noted, while the above embodiments have disclosed arrangements of CAM devices having four CAM blocks, the present embodiment is not limited to any particular number of CAM blocks. To illustrate this, embodiments that include six CAM blocks will now be described with reference to FIGS. 10A to 11.

Figures 10A, 10B:
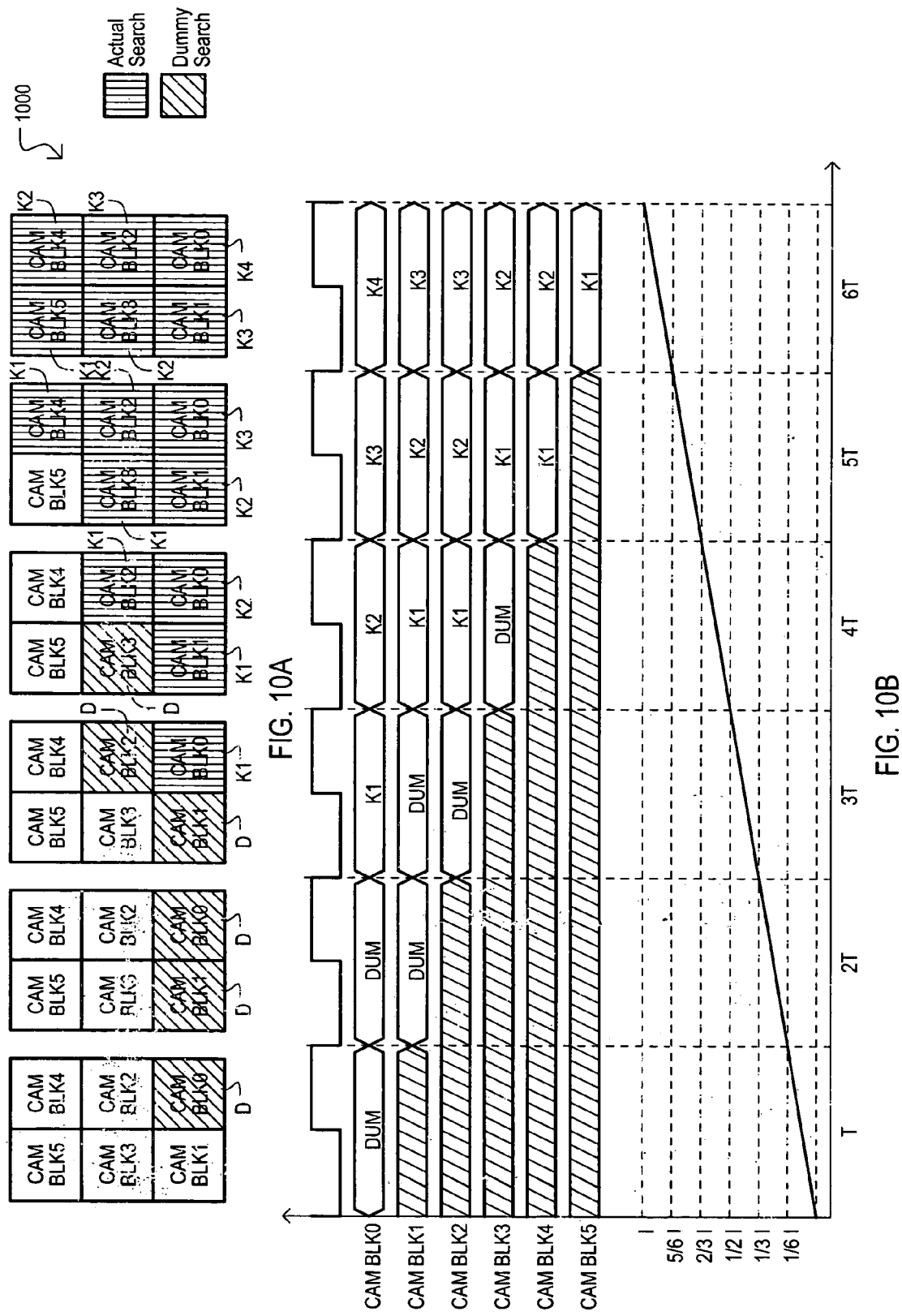
FIG. 10A is a sequence of block diagrams of a CAM device and operation method according to a sixth embodiment of the present invention.
FIG. 10B is a timing diagram showing the operation of FIG. 10A.

FIG. 10A is a sequential representation of a CAM device 1000 having six CAM blocks (BLK0 to BLK5), as it undergoes search operations according to keys K1 to K4. Each view of the CAM device corresponds to the clock cycle directly below in the timing diagram of FIG. 10B.

Like FIG. 1A, in FIG. 10A a dummy search of a given CAM block is shown by diagonal hatching, while an actual search of CAM block is shown by vertical hatching.

Due to the particular actual search sequence, the arrangement of FIG. 10A can begin dummy searches two cycles prior to the start of an actual search. Thus, this embodiment assumes a CAM device has considerable notice (e.g., three cycles) that a search (or other high current drawing operation) is to be executed.

Also like FIG. 1A, FIG. 10A shows an arrangement in which one additional CAM block is turned on in any clock cycle. However, the present invention should not necessarily be construed as limited to such an arrangement.

If reference is made to FIG. 10B, it is seen that current can increase over the six operating cycles (T to 6T) at an even more gradual rate than the case of FIG. 1A. The current increases on average by about 1/6 I every cycle, where I is a differences between the current drawn when the CAM device is completely active, versus when the CAM device is completely idle.

Looked at in another way, absent any dummy searches, the number of CAM blocks activated in response to the four sequential searches would be 1, 3, 5 and 6. According to the embodiment shown, dummy searches can be added so that only one additional block is activated every cycle, for an activation sequence of "1, 2, 3, 4, 5, 6".

Figure 11:
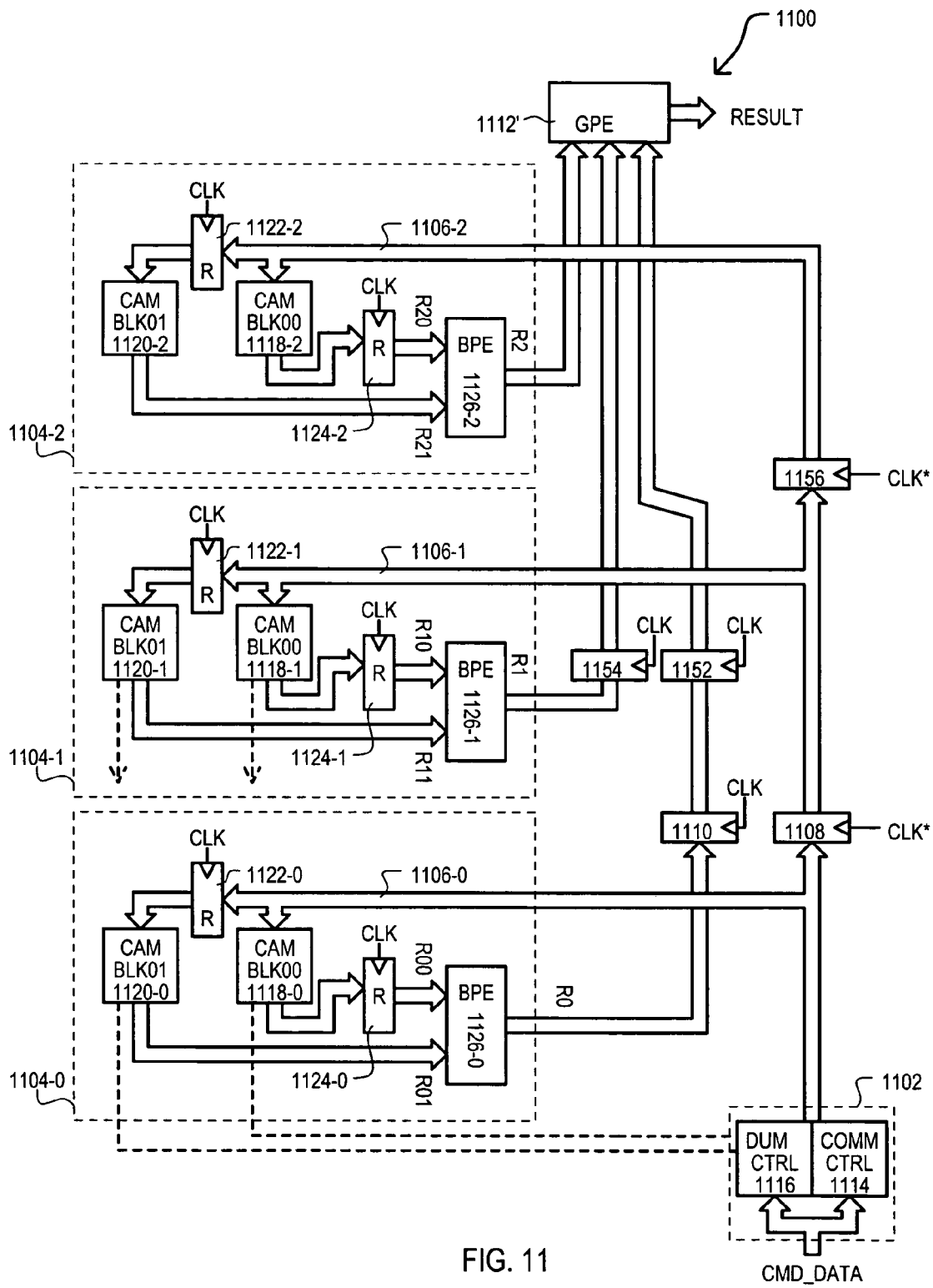
FIG. 11 is a block schematic diagram of a CAM device according to a seventh embodiment of the present invention.

FIG. 11 shows one example of a CAM device according to a seventh embodiment of the present invention. FIG. 11 has the same general structure as FIG. 2, and so similar circuit sections will be referred to by the same reference character, but with the first digit being a "11" instead of a "2".

The embodiment of FIG. 11 can differ from that of FIG. 2, in that is can include a third section 1104-2 having the same general structure as two other sections 1104-0 and 1104-1. In addition, CAM device 1100 can include additional output registers 1152 and 1154 for applying result values to a global priority encoder 1112' at essentially the same time. Still further, another section register 1156 can be included for applying command data to third section 1104-2.

In the CAM device 1100 of FIG. 11, dummy searches can be initiated according to any of the above disclosed or equivalent approaches.

The above embodiments have shown various approaches that can limit current transients by activating CAM blocks to perform dummy operations in order to achieve a gradual sequential activation for all CAM blocks.

Further, while the above examples have described a "dummy search" operation that activates portions of a CAM device, this should not be construed as limiting the invention thereto. Other operations can result in such sequential activation, such as "learn" operations, as but one example.

In addition, while the embodiments have described sequential operations and dummy searches according to a clock signal CLK, it is understood that such a signal should not necessarily be construed as corresponding to an external clock. Such a clock could be multiplied with respect to an external clock and/or divided with respect to an external clock. Still further, other embodiments can include self-timed arrangements in which a clock can be generated from an output value.

An overall effect of the disclosed embodiments can be to greatly reduce current transients in a CAM device as it switches from an idle state to an active state or vice versa. This can allow capacitors mounted on a printed circuit board (PCB) containing one or more CAM devices to have time to respond through the inductance of the packaging and mounting. While the disclosed arrangements may introduce a few extra cycles of latency, throughput is not affected.

As stated above, a reduction in the rise and fall rate of a supply current for a CAM device can reduce a power supply (VDD) sag and/or ground supply rise that can be caused by package inductance. Such an affect can reduce or eliminate the "cold start" problems, noted above.

Such cold start problems are anticipated to get worse as next generation devices increase in capacity, drawing more current, and have faster switching speeds. At the same time, packaging inductance and on-chip capacitance is not anticipated to change dramatically.

For this reason, the various embodiments of the present invention can enjoy wide application in various industries. As but one example, CAM devices and power saving methods of the present invention can be utilized in packet processing devices, such as routers and switches, as look up tables for packet forwarding, classification, and the like. In such an application power supply transients can be reduced without loss of compare result throughput.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
   a plurality of CAM blocks, each CAM block comprising a plurality of CAM entries and having an active mode that consumes more current than an idle mode;
   a command control block that receives command data; and
   a dummy control circuit coupled to at least one CAM block that initiates a dummy operation in the at least one CAM block in response to selected command data prior to an actual operation corresponding to the command data.

2. The CAM device of claim 1, wherein:
   the command data comprises a search command and a search key; and
   the dummy control circuit initiates a dummy search operation in the at least one CAM block in response to the search command, and prior to the search key being applied to the at least one CAM block.

3. The CAM device of claim 1, wherein:
   the plurality of CAM blocks are divided into at least a first section and second section; and
   the dummy control circuit comprises at least one multiplexer (MUX) that selects between a valid search command and a dummy search command.

4. The CAM device of claim 1, wherein:
   the command control block comprises a decoder that generates a search command; and
   the dummy control circuit comprises a block command decoder coupled to selected CAM blocks, each block command decoder activating the respective CAM block in response to a dummy search command.

5. The CAM device of claim 1, wherein:
   the command control block comprises a decoder and a dummy control circuit coupled to receive the command data that issues a dummy search command followed by an actual search command in response to a search request in the command data.

6. The CAM device of claim 1, further including:
   the dummy control circuit comprises a dummy signal activation circuit that sequentially activates at least one dummy activation signal in response to a search request in the command data; and
   an activation circuit coupled to at least one CAM block that activates the at least one CAM block in response to the at least one dummy activation signal.

7. The CAM device of claim 1, wherein:
   the plurality of CAM blocks includes at least four CAM blocks;
   the command control block receives command data according to a periodic clock signal, and in response to a sequence of search requests activates a first CAM block in a first actual search cycle and more than two CAM blocks in a second actual search cycle; and
   the dummy control circuit activates one CAM block with a dummy search prior to the first search cycle and a second CAM block with the dummy search in the first search cycle.

8. The CAM device of claim 1, wherein:
   the plurality of CAM blocks includes at least six CAM blocks;
   the command control block receives command data according to a periodic clock signal, and in response to a sequence of search requests activates a first CAM block in a first search cycle and activates, first, second and third CAM blocks in a second search cycle; and
   the dummy control circuit activates one CAM block with a dummy search two cycles prior to the first search cycle, and activates two CAM blocks with a dummy search one cycle prior to the first search cycle.

9. The CAM device of claim 1, further including:
   the plurality of CAM blocks are arranged into a plurality of sections, each section including at least a first CAM block and a second CAM block separated by an activation control circuit; wherein
   each activation control circuit selectively activates CAM entries in the corresponding second CAM block based on search results of a corresponding entries in the first CAM block.

10. A content addressable memory (CAM) device, comprising:
    a first section comprising at least a first CAM block coupled to a first command data bus and a second CAM block coupled to the first command data bus by first block register;
    a second section, comprising at least a second command data bus coupled to the first command data bus by a first section register, a third CAM block coupled to the second command data bus, and a fourth CAM block coupled to the second command data bus by second block register; and
    a control block that receives search command data, and in response to a search requests, outputs a dummy search command that is not required to generate valid search result data followed by an actual search command that generates valid search result data.

11. The CAM device of claim 10, wherein:
    the first section includes a first section priority encoder having a first input coupled to a result output of the first CAM block by a first output register, and a second input coupled to a result output of the second CAM block; and
    the second section includes a second section priority encoder having a first input coupled to a result output of the third CAM block by a second output register, and a second input coupled to a result output of the fourth CAM block.

12. The CAM device of claim 11, further including:
    a global priority encoder having a first input coupled to an output of the first section priority encoder by a first output register, and a second input coupled to an output of the second section priority encoder.

13. The CAM device of claim 10, wherein:
    the first block register, first section register, and second block register are commonly controlled by a same clock signal.

14. A method of activating a content addressable memory (CAM) device in response to command data, comprising the steps of:

(a) receiving at least one command;

(b) sequentially activating an increasing number of CAM blocks in a sequence according to the at least one command; and (c) activating at least one CAM block prior to the start of the sequence and during the sequence according to a dummy activation operation that is not required to generate valid output data from the respective CAM block.

15. The method of claim 14, wherein:

the step (a) further includes decoding command data, and generating the dummy search command for one clock cycle, and generating an actual search command on the next clock cycle.

16. The method of claim 14, wherein:

the step (a) further includes receiving a series of consecutive search commands; and each step of the sequence occurs in one clock cycle, and only one CAM block is switched to an active state in a given clock cycle until all the CAM blocks are in the active state.

17. The method of claim 14, wherein:

the step (c) includes issuing a dummy search to selected CAM blocks, and not other CAM blocks.

18. The method of claim 14, wherein:

the step (c) includes issuing a dummy search to a plurality of CAM blocks, and activating selected of the CAM blocks in response to the dummy search, while not activating other of the CAM blocks in response to the dummy search.

19. The method of claim 14, wherein:

the step (c) includes generating a plurality of dummy activation signals, at least a first activation signal being activated prior to the search sequence, and activating a different CAM block in response to each dummy activation signal.

20. The method of claim 14, further including:

logically arranging CAM blocks into sections, each section including at least a first CAM block and a second CAM block; and step (b) includes, in a search operation, sequentially applying a search key to each section, and within each section, applying a first portion of the search key to the first CAM block and a second portion of the search key to the second CAM block.

21. The method of claim 14, further including:

sequentially de-activating an increasing number of CAM blocks in a sequence, in response to a predetermined number of idle periods.

\* \* \* \* \*